(12) United States Patent
Cato et al.

(10) Patent No.: US 6,438,699 B1
(45) Date of Patent: Aug. 20, 2002

(54) KEY STROKE DETECTION FOR KEYBOARD REMOTE WAKE-UP

(75) Inventors: Robert Thomas Cato; Charles Ray Kirk, both of Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/304,648

(22) Filed: May 4, 1999

(51) Int. Cl.[7] .......................... G06F 1/32; H03K 19/003; H03M 11/26
(52) U.S. Cl. .......................... 713/323; 713/324; 714/44; 341/24; 341/26
(58) Field of Search .................... 713/300–340; 341/22–34; 714/43, 44

(56) References Cited

U.S. PATENT DOCUMENTS

| | | | | |
|---|---|---|---|---|
| 4,581,603 A | * | 4/1986 | Ingold et al. ............... 341/24 |
| 4,649,373 A | * | 3/1987 | Bland et al. ............... 341/22 |
| 5,148,380 A | * | 9/1992 | Lin et al. .................. 713/321 |
| 5,283,906 A | | 2/1994 | Chen ......................... 395/750 |
| 5,355,503 A | * | 10/1994 | Soffel et al. ............... 713/322 |
| 5,386,584 A | * | 1/1995 | Verstegen et al. ........... 710/59 |
| 5,450,080 A | * | 9/1995 | Irwin ........................ 341/26 |
| 5,585,792 A | * | 12/1996 | Liu et al. ................... 341/22 |
| 5,621,401 A | | 4/1997 | Jeon et al. .................. 341/22 |
| 5,629,694 A | * | 5/1997 | Simon et al. ............... 341/22 |
| 5,666,541 A | | 9/1997 | Sellers ................... 395/750.06 |
| 5,669,004 A | | 9/1997 | Sellers ................... 395/750.06 |
| 5,675,810 A | | 10/1997 | Sellers .................... 395/750 |
| 5,692,203 A | * | 11/1997 | Grodevant ................. 713/323 |

* cited by examiner

*Primary Examiner*—Sumati Lefkowitz
(74) *Attorney, Agent, or Firm*—J. Bruce Schelkopf; Kelly K. Kordzik

(57) ABSTRACT

A keyboard is placed into a suspend mode. Upon the detection of the pressing of a key, the keyboard processor is wakened from the suspend mode. No power is consumed during the suspend mode, sine the keyboard processor is not scanning the key matrix. The key matrix drive circuitry may also be tested by monitoring a signal emanating from the key matrix drive circuitry and scanning each of the drive lines in the key matrix. If the signal is altered, then the associated drive line in the keyboard drive circuitry is defective. Testing of sense circuitry is performed by changing pull-up resistors to pull-down resistors and then reading sense lines.

7 Claims, 5 Drawing Sheets

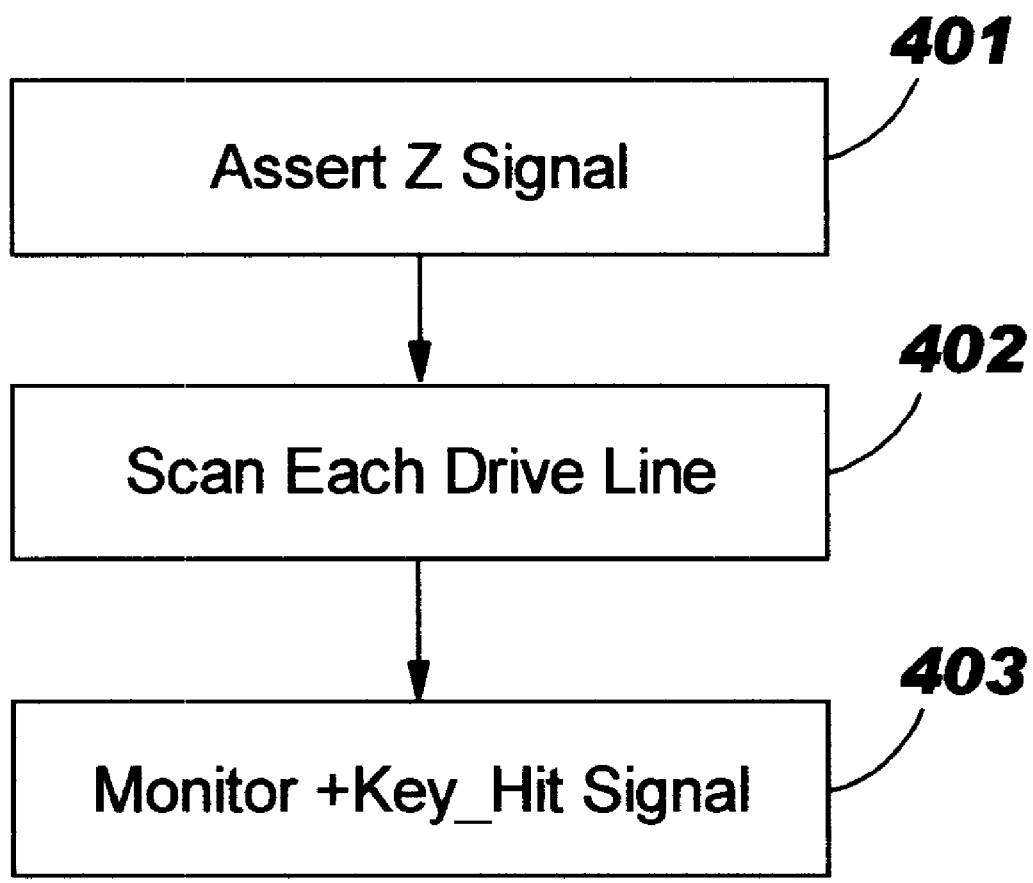

KEY STROKE DETECTION FOR KEYBOARD REMOTE WAKE-UP

TECHNICAL FIELD

The present invention relates in general to computer keyboards, and in particular, to power saving techniques for computer keyboards and keyboard self-test methods.

BACKGROUND INFORMATION

Keyboards attached to computers utilize their own processor (microcontroller) for scanning the keys for detection of a user pressing a key. The processor then encodes which key was pressed, and sends this code to the computer processor. Refer to U.S. Pat. No. 5,355,503 for further discussion of this process.

An important factor is that the keyboard processor is perpetually scanning for the detection of a pressed key, which requires a continual supply of power. In many computer configurations, especially notebook computers, power saving is of utmost importance. Therefore, there are needs to place the keyboard processor and its accompanying circuitry into a suspend mode whereby the processor no longer scans for key hits, but is instead placed into a sleep or suspend mode. The problem is implementing circuitry to exit the keyboard processor out of the suspend mode so that it can detect and encode key hits under normal operation, without requiring an extra input step by the user.

Furthermore, it is important to implement keyboard self-tests, which enhance the manufacturability and maintainability in the field of keyboards.

SUMMARY OF THE INVENTION

The present invention enables a keyboard to be "awakened" from suspend mode when any key is pressed, which then enables the keyboard to remotely wake up its host. The universal serial bus (USB) specification limits the bus current consumed by a suspended USB function to 2.5 milliamps (the limit was previously 500 microamps). The Intel USB microprocessor consumes too much power to be used during suspend mode, so it is very difficult to scan a keyboard during suspend mode. However, the present invention is not limited to use in USB keyboards.

In the present invention, when a key is pressed, its switch connects a row and a column in a matrix for decoding which keys are pressed. Detection of which row is connected to which column enables the keyboard's microprocessor to determine which key is pressed. When the keyboard is in a suspend mode, no current flows through the keyboard matrix driving and sense lines. However, when a key is pressed, current will be conducted from a sense line to a drive line and through one of several diodes, to produce a "key hit" signal that is communicated to the keyboard processor. Upon receipt of this key hit signal, the keyboard processor will exit out of suspend mode thereby resuming scanning of the key matrix for key presses. The "key hit" signal does not indicate which key was pressed.

The "wake-up" circuitry is also used to perform part of the keyboard's self-test to ensure the key matrix drive circuitry is working. The self-test is further enhanced by the keyboard's capability of changing the key matrix sense line pull-up resistors into pull-down resistors and then having the processor read the difference.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 illustrates a process for testing the keyboard.

DETAILED DESCRIPTION

Figure 1:
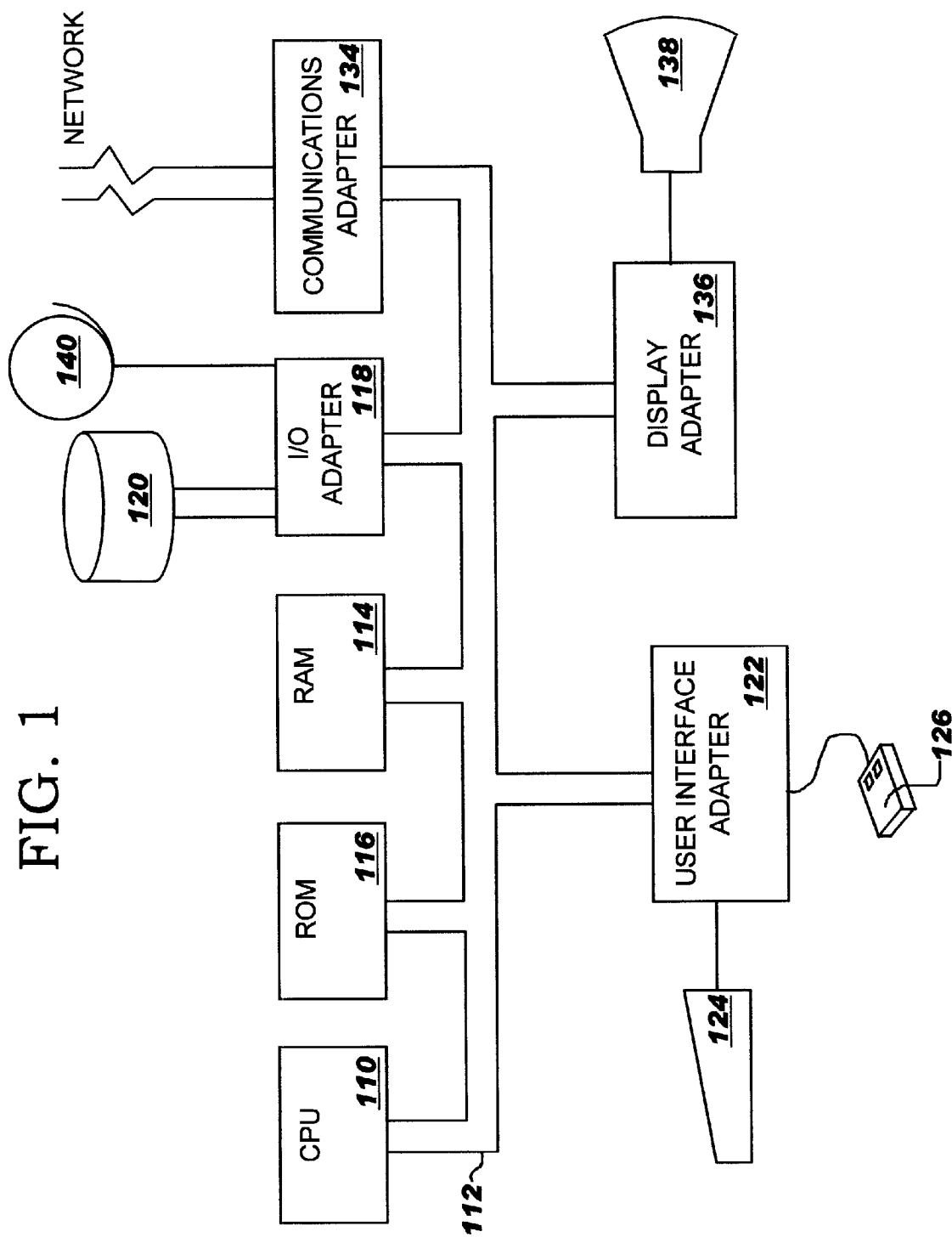
FIG. 1 illustrates a data processing system configured in accordance with the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

A representative hardware environment for practicing the present invention is depicted in FIG. 1, which illustrates a typical hardware configuration of workstation 113 in accordance with the subject invention having central processing unit (CPU) 110, such as a conventional microprocessor, and a number of other units interconnected via system bus 112. Workstation 113 includes random access memory (RAM) 114, read only memory (ROM) 116, and input/output (I/O) adapter 118 for connecting peripheral devices such as disk units 120 and tape drives 140 to bus 112, user interface adapter 122 for connecting keyboard 124, mouse 126, and/or other user interface devices such as a touch screen device (not shown) to bus 112, communication adapter 134 for connecting workstation 113 to a data processing network, and display adapter 136 for connecting bus 112 to display device 138.

Keyboard 124 is implemented and designed in accordance with the present invention. As partially illustrated in FIGS. 2A and 2B, the key switches in a keyboard form a matrix arranged in rows and columns (noted as SENSE and DRIVE lines). When a key (not shown) is pressed, its switch connects a row and a column. Detection of which row is connected to which column enables the keyboard's microprocessor 205 to determine which key is pressed. The key matrix connects the key button SENSE lines (columns), designated as SENSE 0 . . . SENSE 15, to the key button DRIVE lines (rows), designated as lines DRV0 . . . DRV11. The SENSE lines are coupled to connector 201, while the DRIVE lines are coupled to connector 208.

Keyboard processor 205 is coupled by bus 204 to buffers 202 and 203 and latch 206. Keyboard processor 205 enables buffer 202 by buffer enable signal-BE1, and enables buffer 203 by buffer enable signal-BE2. Furthermore, keyboard processor 205 enables latch 206 through latch enable signal LE1. Thus, keyboard processor 205 through bus 204 (bus lines D[0:7]) is able to read from buffers 202 and 203 and write through latch 206.

Through latch 206, the keyboard processor 205 is able to rapidly increment the key matrix drive circuit (in this example, an analog multiplexor) 207 address to cause the key matrix drive circuit 207 to briefly select each DRIVE line, causing it to be driven to the value of the key matrix drive circuit's input, which in this case is ground. This can be done by keyboard processor 205 encoding the addresses over bus lines D[0:3] through respective outputs 1Q, 2Q, 3Q, and 4Q to inputs S0 . . . S3 in key matrix drive circuit 207. Inputs S0 . . . S3 are pulled up by the pull up circuitry coupled to the voltage of the USB bus (+V_bus), consisting of capacitor C4 and pull out resistors R18–R21. The addresses generated through inputs S0 . . . S3 address drive lines DRV 0 . . . DRV 11 through key matrix drive circuit 207 outputs Y0 . . . Y11.

Meanwhile, keyboard processor 205 through bus 204 reads from the two input buffers 202 and 203 to determine if one of the sixteen SENSE lines SENSE0 . . . SENSE15 have been pulled down. This will occur when a key connected to the selected DRIVE line is pressed. Note that no current flows through the key matrix, or the SENSE line pull up resistors R1–R16, or the DRIVE lines DRV 0 . . . DRV 11 when no key is pressed. The pull up resistors R1–R16 act as either pull up or pull down resistors depending upon the logic_out signal, which is determined by the keyboard processor 205. If the logic_out signal is a "0", then the resistors R1–R16 become pull down resistors. However, if the logic_out signal is a "1", then the resistors R1–R16 act as pull up resistors.

As noted above, buffers 202 and 203 are enabled to permit a read by processor 205 of the SENSE lines SENSE0 . . . SENSE15 when enabled by signals -BE1, and -BE2, respectively, which are enabled through processor 205. Note that buffers 202 and 203 are powered through the +V_bus voltage and the accompanying circuitry including capacitors C1 and C2.

Latch 206 is powered through the +V_bus voltage and the accompanying circuitry including decoupling capacitor C3, while key matrix drive circuit 207 is similarly powered and enabled with capacitor C5 and pull-down resister R23.

The present invention has the advantage of using a passive technique for waking the keyboard processor out of a suspend mode until a key is pressed. Consequently, the present invention uses no current during the suspend mode (no scanning is performed), and only requires the inclusion of diodes, which are very inexpensive.

Figure 2A:
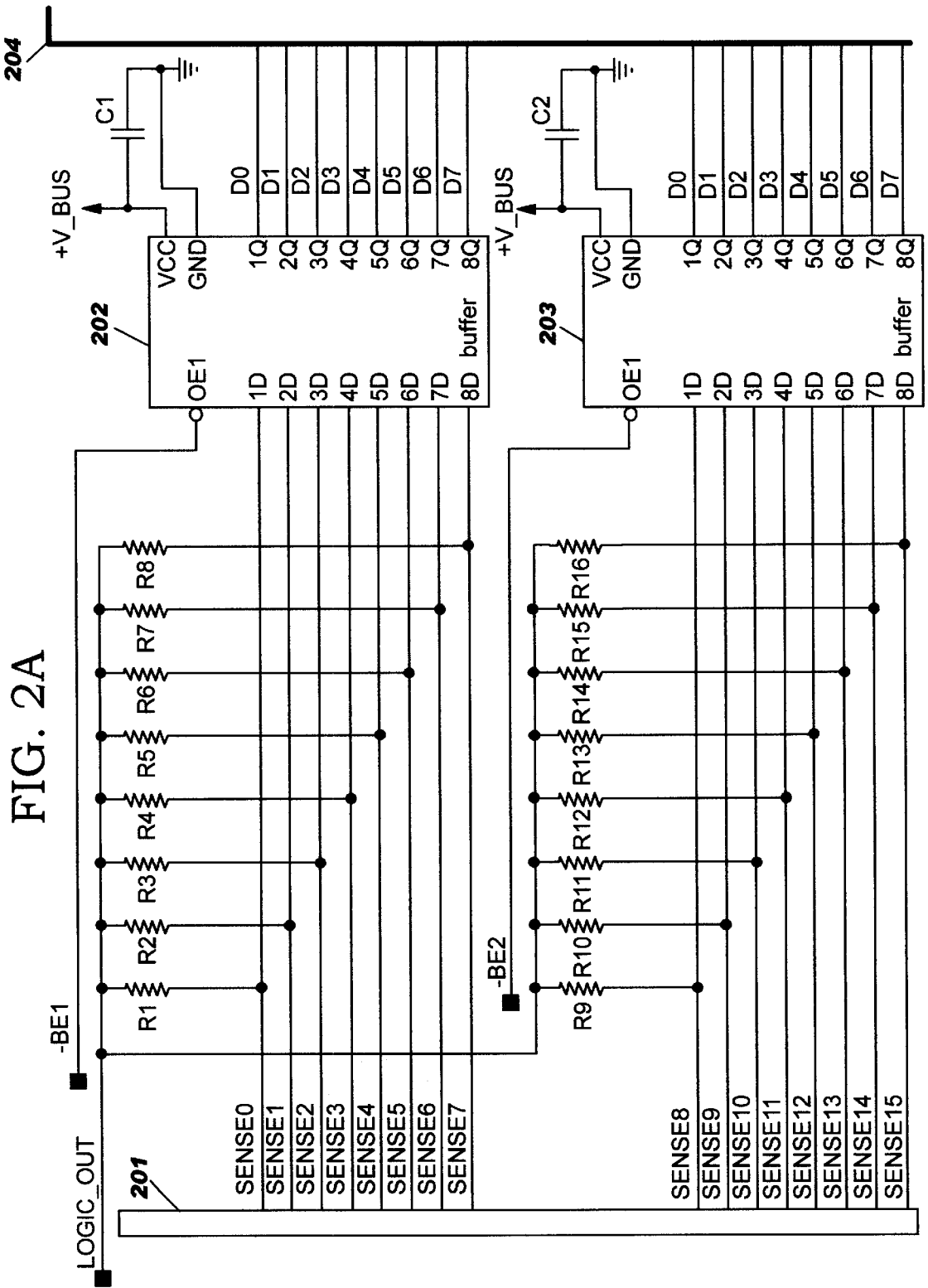
FIGS. 2A and 2B illustrate a circuit diagram of the present invention.
Figure 2B:
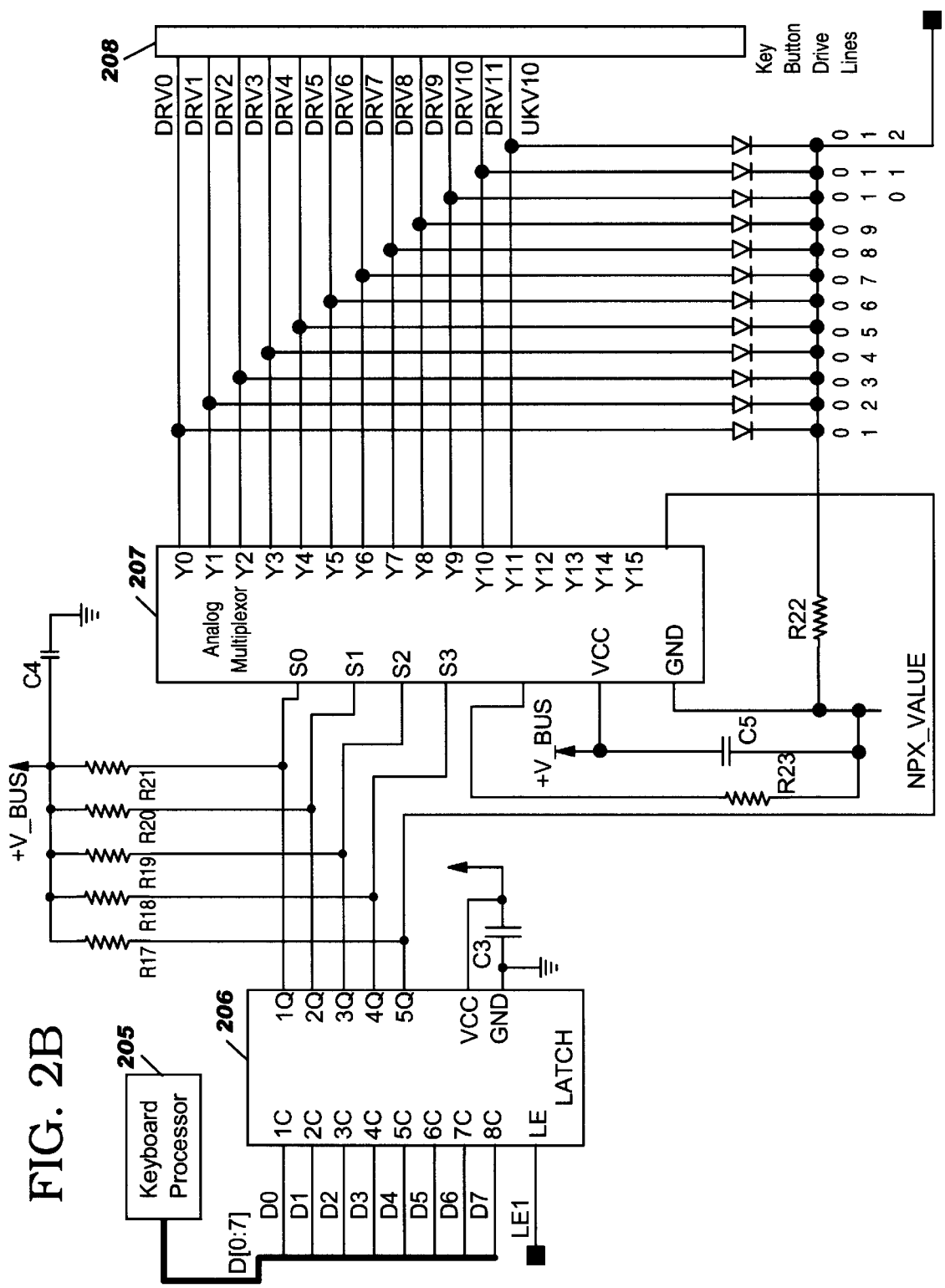

Such diodes are designated in FIG. 2B as diodes D1–D12, with their anodes connected to DRIVE lines DRV 0 . . . DRV 11, respectively, and their cathodes connected through resistor R22 (a pull-down load resistor) to ground and to the keyboard processor 205 to thereby supply the keyboard processor 205 with the "+key_hit" signal.

Figure 3:
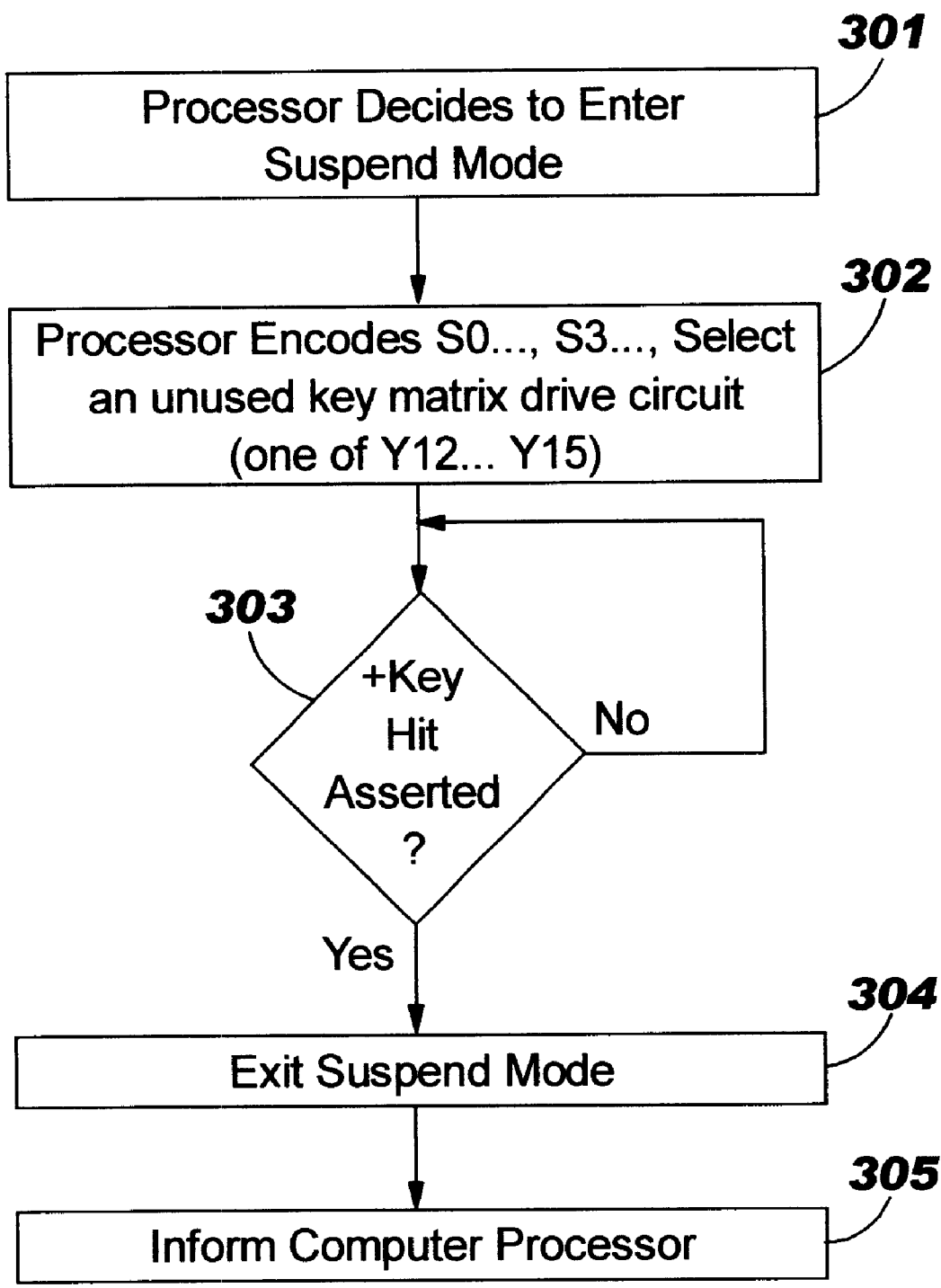
FIG. 3 illustrates a flow diagram implemented in the keyboard processor in accordance with the present invention.

Referring to FIGS. 2A, 2B, and 3, the keyboard processor 205 will decide to enter a suspend mode in step 301. Commencement of the suspend mode may be dictated by the workstation 113 processor 110. In step 302, the processor will encode inputs S0 . . . S3 in key matrix drive circuit 207 through latch 206 to select the address of an unused output of key matrix drive circuit 207, such as, any of unused outputs Y12 . . . Y15. This allows all the used key matrix drive circuit outputs Y0 . . . Y11 to float, and not sink or drive any current. In step 303, the keyboard 124 waits for a key to be pressed. When a key is pressed, it will short one of the SENSE lines SENSE0 . . . SENSE15 to one of the DRIVE lines DRV0 . . . DRV11. Current will then flow from one of the SENSE line pull-up resistors R1–R16, through the key switch, through one of the diodes D1–D12, and through the load resistor R22. This will develop an asserted voltage signal "+key_hit", which goes to one of the interrupts in the processor 205, which then wakes up the processor in step 304. The keyboard processor 205 may then inform processor 110 in step 305 to also now wake up.

When the keyboard 124 is either in normal or suspend mode, keyboard processor 205 writes a "0" for the MPX_value through latch 206 to the Z (common) input of key matrix drive circuit 207. The Z input of key matrix drive circuit 207 is a common point that is connected to all of the sixteen switches Y0 . . . Y15. Use of this Z input can be alternatively used to test for defects in the key matrix drive circuitry. The keyboard processor 205 during this test mode will assert the MPX_value to be a "1", which is then provided to all of switches Y0 . . . Y15. These "1" values will cause each of diodes D1–D12 to conduct one at a time while the keyboard processor 205 addresses each of the DRIVE lines DRV 0 . . . DRV 11 through the select lines S0 . . . S3. If the key matrix drive circuit 207 is operating correctly, then the "+key_hit signal" will always be asserted. However, if there is a defect in the key matrix drive circuit 207, then as the defective output is addressed, its associated DRIVE line DRVx will not conduct the "1" signal from the Z input of key matrix drive circuit 207 through its associated switch Yx to its respective diode, resulting in a negated "+key_hit" signal. This will inform the keyboard processor 205 of which exact key matrix drive circuit output is defective.

"Logic_out" is used by the keyboard processor for diagnostic purposes to force the inputs of buffers 202 and 203 to known states ("1", then "0", then "1"), so the buffers then provide known data patterns ("FF" hex, then "00" hex, then "FF" hex) to the keyboard processor.

Although the present invention and its advantages have been described in detail, it should be understood that various changes, substitutions and alterations can be made herein without departing from the spirit and scope of the invention as defined by the appended claims.

What is claimed is:

1. A data processing system keyboard, comprising:

a processor;

a key matrix;

sense lines with a pull-up value controlled by the processor;

a key matrix drive circuit, having a value addressable by the processor, coupled to drive lines coupled to the key matrix;

a plurality of diodes each coupled to a specified one of the drive lines; and a signal line coupled between the plurality of diodes and the processor, wherein the processor includes circuitry for testing the key matrix, wherein the key matrix drive circuit includes a common input that is coupled to all of the drive lines connected to the key matrix drive circuit and which is selectable by the processor to drive an asserted value onto one of the drive lines at a time which is then driven through one of the diodes to the signal line, and, wherein the testing circuitry includes circuitry for then scanning all drive lines coupled to the key matrix drive circuit to determine which portion of the key matrix drive circuit causes the asserted value on the signal to become negated.

2. The keyboard as recited in claim 1, wherein the processor includes circuitry for entering a suspend state and circuitry for addressing an unused output of the key matrix drive circuit during the suspend state.

3. The keyboard as recited in claim 2, wherein if a key is pressed while the processor is in the suspend state, a signal will be driven through one of the plurality of diodes to the signal line and to the processor, wherein the processor includes circuitry for waking the processor from the suspend state into an active state in response to receipt of the signal over the signal line.

4. The keyboard as recited in claim 3, further comprising a latch coupled to the processor by a data bus and to the key matrix drive circuit by a plurality of select lines through which the processor addresses the drive lines through the key matrix drive circuit.

5. A method for testing a keyboard that includes a key matrix for detecting a key press, and a plurality of drive lines and sense lines coupled to the key matrix, the method comprising the steps of:

a keyboard processor sending an asserted signal to an input of a key matrix drive circuit having a plurality of outputs coupled to the plurality of drive lines, wherein the input is connected to the plurality of outputs thereby causing the asserted signal to be one at a time driven onto the plurality of drive lines;

coupling the plurality of drive lines to a key hit signal line that is coupled to the keyboard processor;

the keyboard processor scanning outputs of the key matrix drive circuit and observing the key hit signal line each time an address of the key matrix drive circuit is changed; and determining if the key hit signal line ever is negated during the scanning of the key matrix drive circuit outputs.

6. The method as recited in claim 5, wherein the keyboard processor correlates which drive line was addressed when the key hit signal line is negated to determine which key matrix drive circuit output location in the keyboard is defective.

7. The method as recited in claim 6, wherein the plurality of drive lines are coupled to the key hit signal line through a plurality of diodes.

* * * * *